(12) United States Patent
Mou

(10) Patent No.: US 11,245,083 B2
(45) Date of Patent: Feb. 8, 2022

(54) ORGANIC LIGHT-EMITTING DEVICE AND DISPLAY PANEL

(71) Applicants: Chengdu BOE Optoelectronics Technology Co., Ltd., Chengdu (CN); BOE Technology Group Co., Ltd., Beijing (CN)

(72) Inventor: Xin Mou, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 242 days.

(21) Appl. No.: 16/427,668

(22) Filed: May 31, 2019

(65) Prior Publication Data

US 2020/0067008 A1 Feb. 27, 2020

(30) Foreign Application Priority Data

Aug. 23, 2018 (CN) .......................... 201810968974.7

(51) Int. Cl.
  *H01L 51/50* (2006.01)
  *H01L 51/52* (2006.01)
  *H01L 51/00* (2006.01)

(52) U.S. Cl.
  CPC ...... *H01L 51/5012* (2013.01); *H01L 51/5004* (2013.01); *H01L 51/5275* (2013.01);
  (Continued)

(58) Field of Classification Search
  None
  See application file for complete search history.

(56) References Cited

U.S. PATENT DOCUMENTS

| 10,333,078 | B2 | 6/2019 | Tanabe et al. |
| 2017/0309828 | A1 | 10/2017 | Tanabe et al. |

(Continued)

FOREIGN PATENT DOCUMENTS

| CN | 2935479 Y | 8/2007 |
| CN | 104835916 A | 8/2015 |

(Continued)

OTHER PUBLICATIONS

First Office Action, including Search Report, for Chinese Patent Application No. 201810968974.7, dated Dec. 23, 2019, 14 pages.

(Continued)

*Primary Examiner* — Gregory D Clark
(74) *Attorney, Agent, or Firm* — Westman, Champlin & Koehler, P.A.

(57) ABSTRACT

An organic light-emitting device and a display panel are provided. The organic light-emitting device has an anode, a cathode opposite to the anode, and a light-emitting layer between the anode and the cathode. The light-emitting layer has a host material, a light-emitting guest, and an auxiliary guest, wherein the light-emitting guest is a fluorescent dye, and the auxiliary guest is an organic substance having a thermally activated delayed fluorescence property, wherein a section in which a doping concentration of the auxiliary guest gradually increases or gradually decreases is present along a direction from the anode toward the cathode.

14 Claims, 4 Drawing Sheets

(52) U.S. Cl.
CPC ...... *H01L 51/0067* (2013.01); *H01L 51/0071* (2013.01); *H01L 51/0072* (2013.01); *H01L 2251/5346* (2013.01); *H01L 2251/558* (2013.01)

(56) References Cited

U.S. PATENT DOCUMENTS

| | | |
|---|---|---|
| 2018/0190926 A1 | 7/2018 | Liao |
| 2019/0019971 A1 | 1/2019 | Xie et al. |
| 2019/0115554 A1 | 4/2019 | Xie |
| 2021/0159438 A1* | 5/2021 | Pickett ................ H01L 51/5024 |

FOREIGN PATENT DOCUMENTS

| | | | | |
|---|---|---|---|---|
| CN | 105679957 A | | 6/2016 | |
| CN | 106206996 A | | 12/2016 | |
| CN | 106687561 A | | 5/2017 | |
| CN | 106898699 A | | 6/2017 | |
| CN | 106920884 A | | 7/2017 | |
| CN | 107123749 A | | 9/2017 | |
| CN | 107331783 A | | 11/2017 | |
| CN | 107492596 A | | 12/2017 | |
| CN | 107919442 A | | 4/2018 | |
| CN | 108011047 A | | 5/2018 | |
| CN | 108365113 A | * | 8/2018 | ............. H01L 51/50 |
| EP | 3 226 318 A1 | | 10/2017 | |

OTHER PUBLICATIONS

Second Office Action, including Search Report, for Chinese Patent Application No. 201810968974.7, dated Jun. 15, 2020, 12 pages.

* cited by examiner

ORGANIC LIGHT-EMITTING DEVICE AND DISPLAY PANEL

CROSS-REFERENCE TO RELATED APPLICATION

This disclosure claims the priority of Chinese Patent Application No. 201810968974.7 filed on Aug. 23, 2018, which is incorporated herein in its entirety by reference.

TECHNICAL FIELD

This disclosure relates to the technical field of display, and particularly to an organic light-emitting device and a display panel.

BACKGROUND ART

The organic light-emitting diode (OLED) is praised as the next-generation display and has attracted more and more attentions in recent years, due to advantages such as self light emission, high efficiency, bright color, good lightness and thinness, low power consumption, good bendability, and the like. It is always a direction, in which researchers in the art make efforts, to design an organic electroluminescent device having a higher efficiency and a longer service life.

Light emission of a fluorescent dye assisted by thermally activated delayed fluorescence has been proposed. However, the light emission efficiency and the service life of this device still need to be improved.

SUMMARY OF THE INVENTION

An embodiment of this disclosure provides an organic light-emitting device, comprising an anode, a cathode opposite to the anode, and a light-emitting layer between the anode and the cathode. Materials of the light-emitting layer comprise a host material, a light-emitting guest, and an auxiliary guest, the light-emitting guest is a fluorescent dye, and the auxiliary guest is an organic substance having a thermally activated delayed fluorescence property, wherein a section in which a doping concentration of the auxiliary guest gradually increases or gradually decreases is present along a direction from the anode toward the cathode.

Optionally, the light-emitting layer comprises at least two light-emitting sublayers adjacent to each other, the auxiliary guest has a uniform doping concentration in each of the light-emitting sublayers, and a doping concentration of the auxiliary guest in each of the light-emitting sublayers is different from a doping concentration of the auxiliary guest in a light-emitting sublayer adjacent thereto.

Optionally, the difference between doping concentrations of auxiliary guests in adjacent light-emitting sublayers is 1 wt % to 10 wt %.

Optionally, the auxiliary guest in each of the light-emitting sublayers has a doping concentration of 5 wt % to 50 wt %.

Optionally, each of the light-emitting sublayers has a thickness of 20 Angstroms to 400 Angstroms.

Optionally, majority carriers in the host material are electrons, and wherein a doping concentration of the auxiliary guest gradually increases along a direction from the anode toward the cathode.

Optionally, majority carriers in the host material are holes and wherein a doping concentration of the auxiliary guest gradually decreases along a direction from the anode toward the cathode.

Optionally, a thickness of the section comprises 50% or more of a thickness of the light-emitting layer along a direction from the anode toward the cathode.

Optionally, a material of the auxiliary guest comprises at least one of PXZ-TRZ, 4CzIPN, 4CzTPN, 4CzTPN-Me, and 4CzTPN-Ph.

Optionally, the light-emitting guest has a doping concentration of 0.1 wt % to 10 wt %.

Optionally, the light-emitting guest has a doping concentration of 0.2 wt % to 5 wt %.

Optionally, it further sequentially comprises a hole transport layer between the anode and the light-emitting layer, and an electron transport layer between the light-emitting layer and the cathode, and the organic light-emitting device further comprises:

an electron blocking layer between the hole transport layer and the light-emitting layer, and/or a hole blocking layer between the light-emitting layer and the electron transport layer.

Optionally, a light emergent surface of the organic light-emitting device is on a side of the anode departing from the cathode, and the organic light-emitting device further comprises a light extraction layer on a side of the cathode departing from the light-emitting layer.

Optionally, the light extraction layer has an average refractive index of greater than or equal to 1.7 in a range of visible light.

An embodiment of this disclosure further provides a display panel, comprising the organic light-emitting device described above.

DESCRIPTION OF DRAWINGS

The accompanying drawings are intended to provide further understanding of the technical solution of this disclosure, and constitute a part of the specification and are used for explaining the technical solution of this disclosure together with embodiments of the present application, but do not constitute limitations to the technical solution of this disclosure.

DESCRIPTION OF EMBODIMENTS

In order to enable objects, technical solutions, and advantages of this disclosure to be more clear and obvious, embodiments of this disclosure will be illustrated in detail below in conjunction with accompanying drawings. It is to be indicated that embodiments in the present application and features in the embodiments may be arbitrarily combined with each other without being conflicted.

An unbalanced exciton concentration in a light-emitting layer will result in a reduced efficiency and an attenuated brightness of an organic light-emitting device. Therefore, how to balance the exciton concentration in a light-emitting layer so as to slow down the attenuation of the brightness of an organic light-emitting device also becomes a technical problem urgent to be solved in the field of organic light-emitting devices. In order to balance the exciton concentration in a light-emitting layer, an organic light-emitting device in an embodiment of this disclosure is proposed.

Technical contents of this disclosure will be introduced in detail below by specific embodiments. In these embodiments, doping concentrations are based on weight percentage.

In this disclosure, the presence of a section in which a doping concentration of the auxiliary guest gradually increases or gradually decreases indicates that the doping concentration of the auxiliary guest changes in a region. This section may be along a direction from the anode toward the cathode throughout the light-emitting layer, or may be only a part of a light-emitting layer.

In this disclosure, "doping" may be performed in a manner of lamination, or may be performed in a manner of mixing. In a manner of lamination, a guest and a host are both produced into forms of thin films and then laminated together. In accompanying drawings of this disclosure, doping of the auxiliary guest and doping of the light-emitting guest are both represented in a manner of mixing, but are illustrative only. The doping concentration refers to a concentration of a guest in a light-emitting layer or a light-emitting sublayer.

Figure 1:
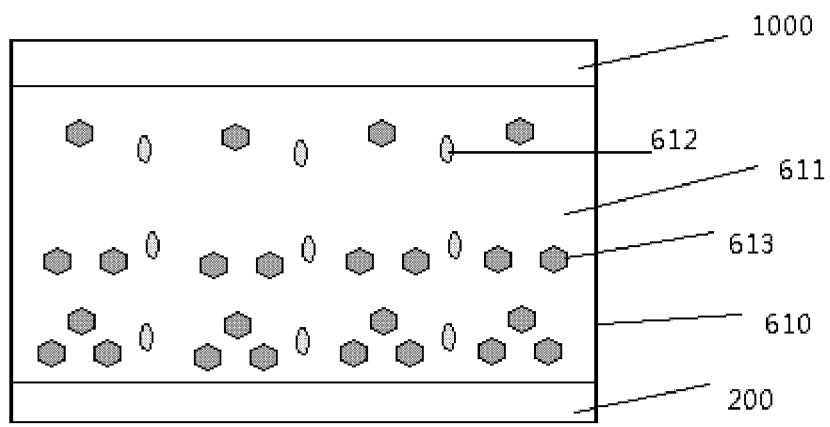
FIG. 1 is a schematic diagram of the structure of an organic light-emitting device in an embodiment of this disclosure.

FIG. 1 is a schematic diagram of the structure of an organic light-emitting device in an embodiment of this disclosure. It comprises an anode 200, a cathode 1000, and a light-emitting layer 610 between the anode and the cathode. The light-emitting layer 610 comprises a host material 611, a light-emitting guest 612, and an auxiliary guest 613. The doping concentration of the auxiliary guest gradually decreases from the anode toward the cathode throughout the light-emitting layer. The doping concentration of the light-emitting guest is substantially uniform.

FIG. 1 is only an embodiment of this disclosure. The doping concentration of the auxiliary guest may also gradually increase, or first increase and then decrease, throughout the light-emitting layer. Furthermore, a functional layer, for example a carrier injection layer, a carrier blocking layer, and the like, may be provided between an electrode and the light-emitting layer.

With respect to this light-emitting layer, it is advantageous to enlarge the recombination area of excitons and improve the uniformity of the exciton concentration in different positions of the light-emitting sublayer so as to balance the exciton concentration in the light-emitting layer. Therefore, the light emission efficiency and the service life of the organic light-emitting device are improved.

Figure 2:
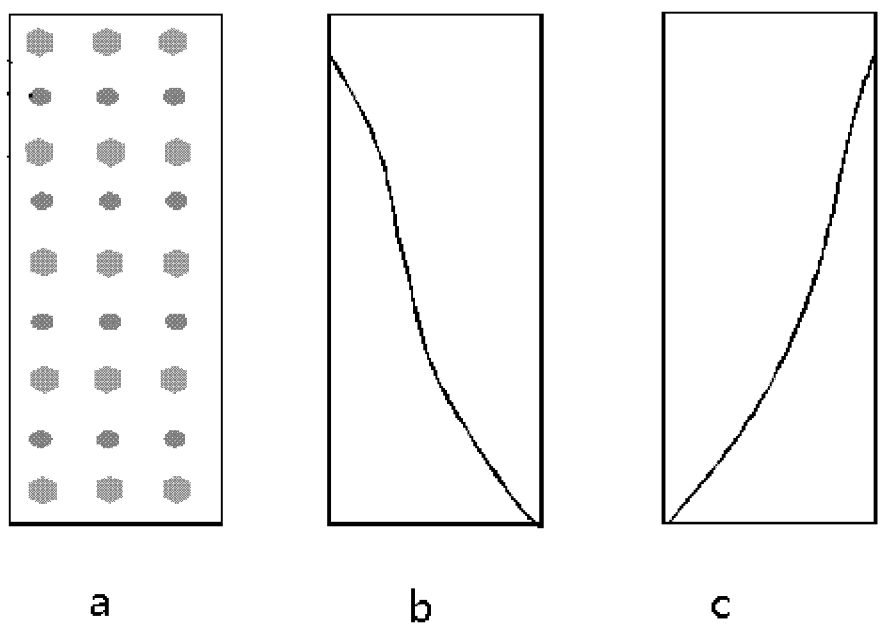
FIG. 2 shows the distribution of the exciton concentration when an auxiliary guest is uniformly distributed in throughout a light-emitting layer.

FIG. 2 shows the distribution of the exciton concentration in a light-emitting layer when an auxiliary guest is uniformly distributed in a light-emitting layer. In FIG. 2a, the left side is an anode side, and the right side is a cathode side. Therefore, holes are injected from the left side, and electrons are injected from the right side.

As is well known, carrier, i.e., electrons and holes, may be divided into majority carriers and minority carriers according to the quantity of the carriers in an organic light-emitting device, and the concentration of majority carriers is far higher than that of minority carriers. It has been found by the inventor that the concentration of excitons plays a significant role in light emission in a mode of fluorescent light emission aided with thermally activated delayed fluorescence of this disclosure. In view of simplification, an exciton may be considered as an electron-hole pair. FIG. 2b shows a case where majority carriers are electrons. At this time, the concentration of electrons in the light-emitting layer is far greater than that of holes. At this time, excitons are formed from holes injected near the anode and majority carrier electrons with assistance of the auxiliary guest, and the exciton concentration there is the highest. With gradually departing from the anode, the concentration of holes greatly decreases, and the exciton concentration decreases therewith in the case where the doping concentration of the auxiliary guest is unchanged. The exciton concentration is almost zero near the cathode. FIG. 2c shows a case where majority carriers are holes. At this time, the concentration of holes in the light-emitting layer is far greater than that of electrons. At this time, excitons are formed from electrons injected near the cathode and majority carrier holes with assistance of the auxiliary guest, and the exciton concentration there is the highest. With gradually departing from the cathode, the concentration of electrons greatly decreases, and the exciton concentration decreases therewith in the case where the doping concentration of the auxiliary guest is unchanged. The exciton concentration is almost zero near the anode. This distribution of the exciton concentration in the light-emitting layer results in a very narrow recombination area of excitons, leading to a low light emission efficiency and a short service life of the device.

Figure 3:
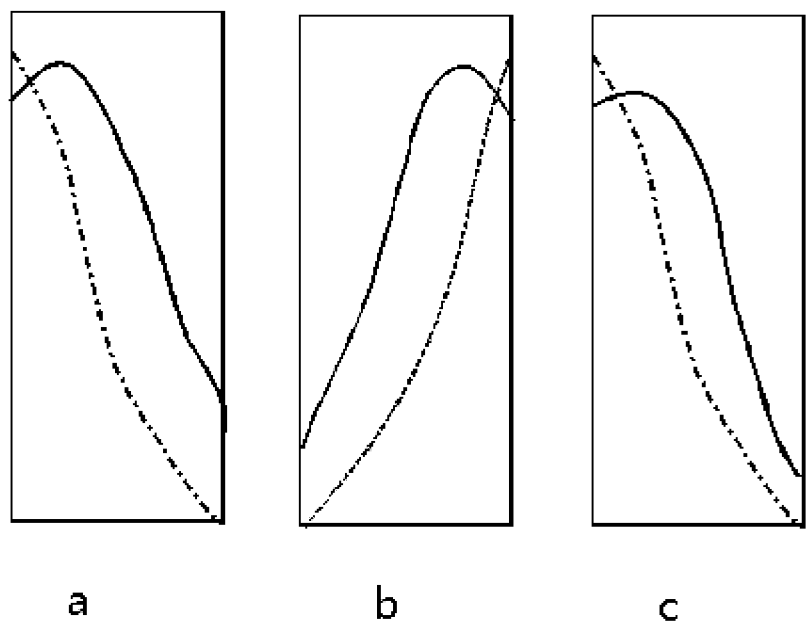
FIG. 3 shows the distribution of the exciton concentration after the doping concentration of the auxiliary guest changes.

FIG. 3 schematically shows distribution comparisons of the exciton concentration when the doping concentration of the auxiliary guest is not uniform in the light-emitting layer in FIG. 2, wherein dashed lines indicate the cases of FIG. 2. FIG. 3a indicates a case where majority carriers are electrons and the doping concentration of the auxiliary guest gradually increases from the anode toward the cathode throughout the light-emitting layer. At this time, since the concentration of the auxiliary guest is relatively high in a direction close to the cathode, the concentration of the excitons formed relatively increases. Therefore, the distribution of the exciton concentration is relatively uniform with respect to the case of FIG. 2. In this way, the recombination area of excitons is widened, and it is advantageous to improve the light emission efficiency and the service life of the device.

Similarly, FIG. 3b is a case where majority carriers are holes and the doping concentration of the auxiliary guest gradually decreases from the anode toward the cathode throughout the light-emitting layer. At this time, since the concentration of the auxiliary guest is relatively high in a direction close to the anode, the concentration of the excitons formed relatively increases. Therefore, the distribution of the exciton concentration is relatively uniform with respect to the case of FIG. 2. In this way, the recombination area of excitons is widened, and it is advantageous to improve the light emission efficiency and the service life of the device.

In this disclosure, "gradual" increase and decrease include continuous increase and decrease, and also include stepwise increase and decrease. That is, a concentration gradient is formed. In the case of stepwise increase or decrease, an unchanged concentration may also be regarded as a part of gradual increase or decrease.

The gradual increase or decrease of the doping concentration of the auxiliary guest described above may occur throughout the light-emitting layer, or may only occur in a certain section. There may be a plurality of these sections. For example, the thickness of this section may comprise, for example, 50% or more, 80% or more, or 90% or more of the thickness of the light-emitting layer (in a cathode-anode direction). In view of providing a sufficiently uniform exciton concentration, the total distance of the section in which the doping concentration of the auxiliary guest gradually increases or gradually decreases should be 50% or more, preferably 80% or more, more preferably 90% or more of the overall thickness of the light-emitting layer.

FIG. 3c indicates a case where majority carriers are electrons and the doping concentration of the auxiliary guest first increases and then decreases from the anode toward the cathode. If the exciton concentration is still relatively large near the interface between the light-emitting layer and the cathode or a functional layer (such as an electron transport layer or an electron injection layer) on the cathode side, leakage of excitons across the interface will occur and the properties of the device will be impacted. To this end, on the basis of FIG. 3a, the increase of the doping concentration of the auxiliary guest may be stopped and turned to decrease in a region near the interface of the cathode side so as to reduce the leakage of excitons. Also, the doping concentration of the auxiliary guest in a region near the interface of the anode side may be slightly lowered in the case where majority carriers are holes, so that the change trend of the doping concentration of the auxiliary guest is still first slight increase and then continuous decrease. An exciton blocking layer is formed in a low doping concentration region near the interface of the anode side.

By appropriately setting the doping concentration of the auxiliary guest, the distribution of the exciton concentration may be allowed to be more uniform in a cathode-anode direction. Overall, the concentration of the auxiliary guest gradually increases from a minority carrier injection side to a majority carrier injection side, and furthermore, may decrease again at the interface of the majority carrier injection side. Such a decrease section may be 40 nm or less, for example as low as 2 nm. However, other fluctuations of the doping concentration are also encompassed in the scope of this disclosure. For example, individual decrease regions may be present in a process of gradual increase, as long as light emission is not significantly impacted.

Figure 4:
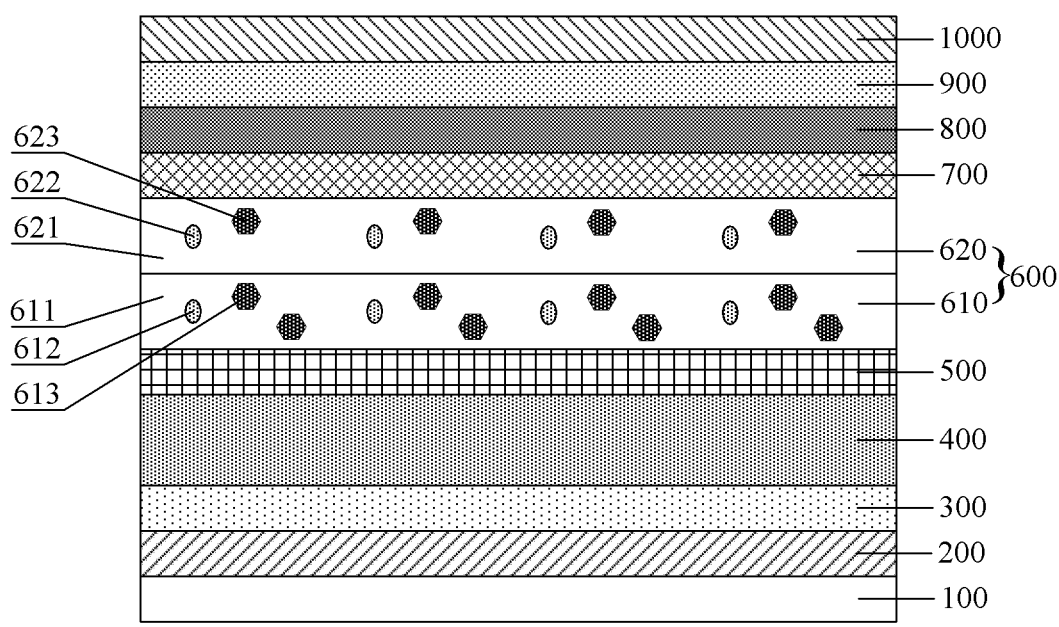
FIG. 4 is a schematic diagram of the structure of an organic light-emitting device in an embodiment of this disclosure.

FIG. 4 is a schematic diagram of the structure of an organic light-emitting device in an embodiment of this disclosure. It comprises an anode 200, a cathode 1000, and a light-emitting layer 600, wherein the cathode 1000 is opposite to the anode 200, the light-emitting layer 600 is between the anode 200 and the cathode 1000. Materials of the light-emitting layer 600 comprise a host material, a light-emitting guest, and an auxiliary guest, the light-emitting guest is a fluorescent dye, and the auxiliary guest comprises an organic substance having a thermally activated delayed fluorescence (TADF) property. The host material may comprise a micromolecular organic material, for example a CBP material (4,4'-bis(9-carbazolyl)biphenyl), an mCBP material (3,3'-bis(9-carbazolyl)biphenyl), and the like.

The light-emitting layer may comprise at least two light-emitting sublayers. The doping concentrations of the auxiliary guests in the light-emitting sublayers are different. Along a direction from the anode 200 toward the cathode 1000, the auxiliary guest has a uniform doping concentration in each of the light-emitting sublayers, and a doping concentration of the auxiliary guest in each of the light-emitting sublayers is different from a doping concentration of the auxiliary guest in a light-emitting sublayer adjacent thereto. With respect to this light-emitting layer, it is advantageous to enlarge the recombination area of excitons and improve the uniformity of the exciton concentration in different positions of the light-emitting sublayer so as to balance the exciton concentration in the light-emitting layer. Therefore, the light emission efficiency and the service life of the organic light-emitting device are improved. Compared to forming a doping concentration gradually changed in the same layer, the gradient of the doping concentration may be more readily controlled and more easily achieved in terms of the process in a manner of forming an overall light-emitting layer by providing a plurality of light-emitting sublayers having different doping concentrations.

"At least two" may indicate two, three, four, five, six, or more. As the number of layers becomes more, more precise control over the doping concentration may be obtained and more uniform light emission is in turn obtained, but the number of steps will also increase.

As shown in FIG. 4, the light-emitting layer 600 comprises two light-emitting sublayers. The light-emitting layer 600 sequentially comprises a first light-emitting sublayer 610 and a second light-emitting sublayer 620 in a direction from the anode 200 toward the cathode 1000. In this embodiment, the host material, the light-emitting guest, and the auxiliary guest present in the first light-emitting sublayer 610 are marked as 611, 612, and 613, respectively; the host material, the light-emitting guest, and the auxiliary guest present in the second light-emitting sublayer 620 are marked as 621, 622, and 623, respectively. If the concentration of the auxiliary guest 613 in the first light-emitting sublayer 610 is X1 and the concentration of the auxiliary guest 623 in the second light-emitting sublayer 620 is X2, then X1 and X2 are different and X1>X2 (as shown in FIG. 4), or X1<X2.

Figure 5:
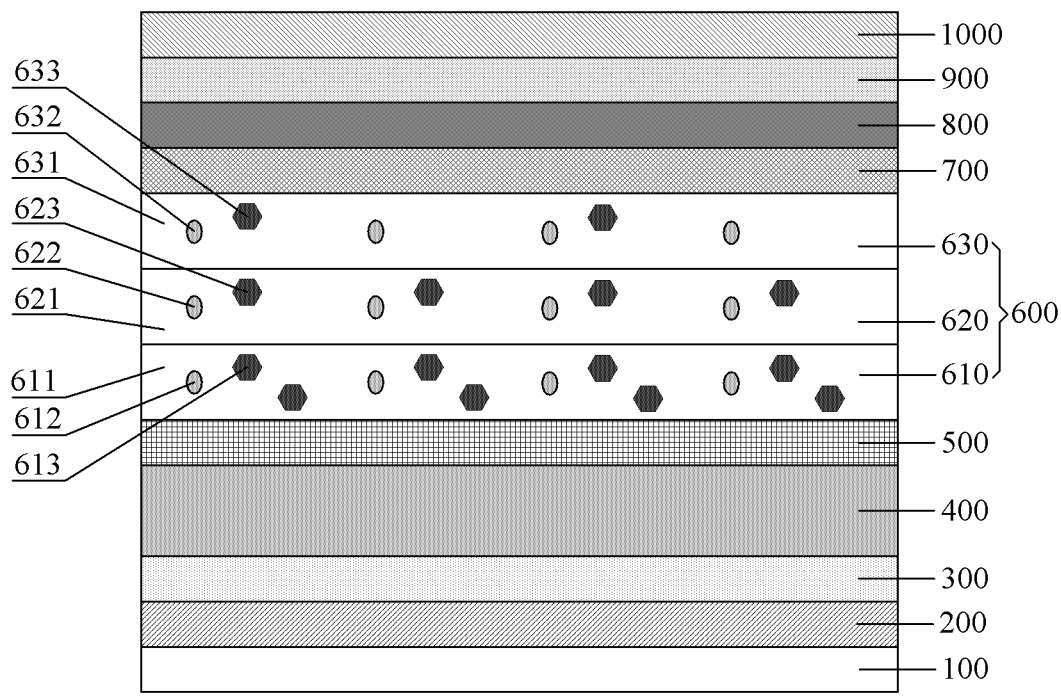
FIG. 5 is a schematic diagram of the structure of an organic light-emitting device in an embodiment of this disclosure.

FIG. 5 is a schematic diagram of the structure of an organic light-emitting device in another embodiment. In FIG. 5, the light-emitting layer comprises three light-emitting sublayers. The light-emitting layer 600 sequentially comprises a first light-emitting sublayer 610, a second light-emitting sublayer 620, and a third light-emitting sublayer 630 in a direction from the anode 200 toward the cathode 1000. the host material, the light-emitting guest, and the auxiliary guest present in the first light-emitting sublayer 610 are marked as 611, 612, and 613, respectively; the host material, the light-emitting guest, and the auxiliary guest present in the second light-emitting sublayer 620 are marked as 621, 622, and 623, respectively; the host material, the light-emitting guest, and the auxiliary guest present in the third light-emitting sublayer 630 are marked as 631, 632, and 633, respectively. If the concentration of the auxiliary guest 613 in the first light-emitting sublayer 610 is X1, the concentration of the auxiliary guest 623 in the second light-emitting sublayer 620 is X2, and the concentration of the auxiliary guest 633 in the third light-emitting sublayer 630 is X3, then X1, X2, and X3 are different from each other and X1>X2 (as shown in the Figure), or X1<X2<X3, or X1<X2 and X2>X3. It is to be noted that FIG. 5 is illustrative and the number of symbols does not indicate a real ratio. Doping of the light-emitting sublayer of this disclosure may also be performed in a manner of lamination.

In a further embodiment, the light-emitting layer may also comprise five light-emitting sublayers. The light-emitting layer sequentially comprises first, second, third, fourth, and fifth light-emitting sublayers in a direction from the anode toward the cathode. The concentrations of the auxiliary guests in the light-emitting sublayers are X1, X2, X3, X4, and X5, respectively. In a direction from the anode toward the cathode, the doping concentration of the auxiliary guest in each of the light-emitting sublayers is different from that of the light-emitting sublayer adjacent thereto. The doping concentrations may monotonously increase or decrease, or may be low on both sides and high in the center, for example X1<X2>X3>X4>X5, X1<X2<X3<X4>X5, and the like.

The host material may comprise a micromolecular organic material, for example a CBP material (4,4'-bis(9-carbazolyl)biphenyl), an mCBP material (3,3'-bis(9-carbazolyl)biphenyl), and the like. The thicknesses of the first light-emitting sublayer 610 and the second light-emitting sublayer 620 may the same or may be different. The object of embodiments of this disclosure may be achieved in both cases. In this embodiment, the light-emitting layer has a thickness of 20 Angstroms to 400 Angstroms, and each of the light-emitting sublayers has a thickness of 20 Angstroms to 200 Angstroms.

The light-emitting guest is a fluorescent dye. The fluorescent dye may comprise at least one of fluorescent dyes suitable for TADF(thermally activated delayed fluorescence)-assisted fluorescence, for example, TBRb (2,8-di-tert-butyl-5,11-bis(4-t-butylphenyl)-6,12-diphenyltetracene, tetra(t-butyl)rubrene), C545T (10-(2-benzothiazolyl)-2,3,6,7-tetrahydro-1,1,7,7-tetramethyl-1H,5H,11H-[1]benzopyrano[6,7,8-ij]quinolizin-11-one), and DCM (4-(dimercaptomethylene)-2-methyl-6-(p-dimethylaminostyryl)-4H-pyrane). The doping concentrations of the light-emitting guests in the light-emitting sublayers are the same. In this embodiment, the doping concentration of the light-emitting guest 612 in the first light-emitting sublayer 610 and the doping concentration of the light-emitting guest 622 in the second light-emitting sublayer 620 are preferably the same, but may also be different. In this embodiment, the light-emitting guest in each of the light-emitting sublayers has a doping concentration of 0.1 wt % to 10 wt %. Preferably, the light-emitting guest in each of the light-emitting sublayers has a doping concentration of 0.2 wt % to 5 wt %. If the doping concentration of the light-emitting guest in the light-emitting sublayer is less than 0.1 wt %, the doping concentration is so small that the light emission intensity of the light-emitting sublayer is relatively weak; if the doping concentration of the light-emitting guest in the light-emitting sublayer is greater than 10 wt %, the doping concentration is so large that the intermolecular interaction is relatively strong, concentration quenching will be easily caused, and the light emission intensity of the light-emitting sublayer is relatively weak. By allowing the doping concentration of the light-emitting guest in each of the light-emitting sublayers to be 0.1 wt % to 10 wt %, concentration quenching will not be caused and the light emission intensity of the light-emitting sublayer is improved.

The auxiliary guest comprises an organic substance having a TADF property, and examples of the organic substance having a TADF property include at least one of PXZ-TRZ, 4CzIPN, 4CzTPN, 4CzTPN-Me ((4s,6s-2,4,5,6-tetra(9H-carbazol-9-yl)isophthalonitrile), and 4CzTPN-Ph. Molecular structural formulae of these organic substances are listed below, respectively.

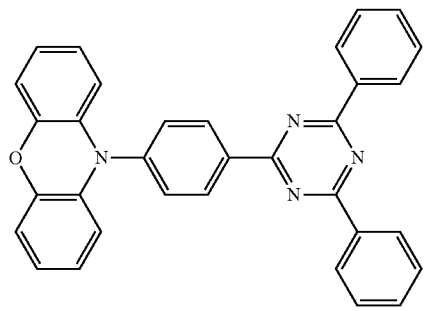

PXZ-TRZ

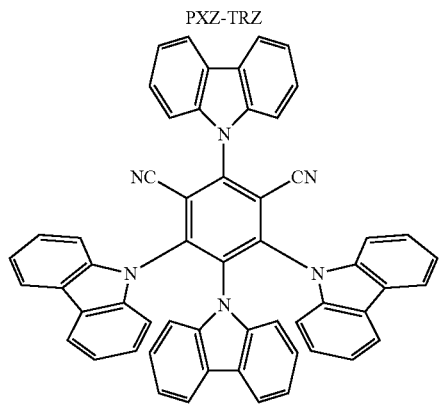

4CzIPN

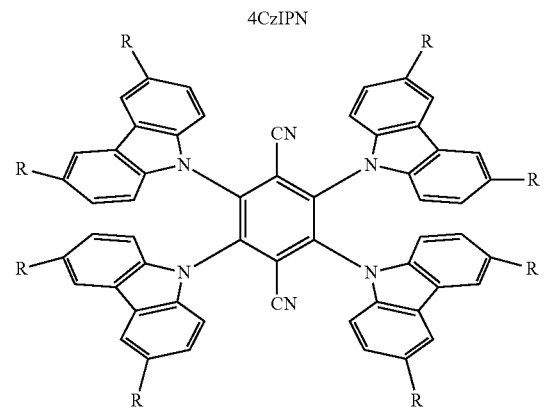

4CzTPN: R = H
4CzTPN-Me: R = Me
4CzTPN-Ph: R = Ph

In this embodiment, the auxiliary guest in each of the light-emitting sublayers has a doping concentration of 5 wt % to 50 wt %. For example, the doping concentration of the auxiliary guest 613 in the first light-emitting sublayer 610 is 5 wt % to 50 wt % and the doping concentration of the auxiliary guest 623 in the second light-emitting sublayer 620 is 5 wt % to 50 wt %, but the doping concentration of the auxiliary guest 613 in the first light-emitting sublayer 610 and the doping concentration of the auxiliary guest 623 in the second light-emitting sublayer 620 are different. In this embodiment, the difference between doping concentrations of auxiliary guests in adjacent light-emitting sublayers is 1 wt % to 10 wt % along a direction from the anode 200 toward the cathode 1000. For example, the difference between doping concentrations of auxiliary guests in adjacent light-emitting sublayers is 5 wt % along a direction from the anode 200 toward the cathode 1000. That is, when the doping concentration of the auxiliary guest 613 in the first light-emitting sublayer 610 is 20, the doping concentration of the auxiliary guest 623 in the second light-emitting sublayer 620 is 15 wt %.

In order to achieve the doping concentrations of the host material, the light-emitting guest, and the auxiliary guest in the light-emitting sublayer, corresponding concentrations may be achieved by controlling the film thicknesses of the respective materials. As a simplified example, in the case where the densities of the host material, the light-emitting guest, and the auxiliary guest are substantially the same, the film thickness of the light-emitting sublayer is 400 Angstroms, the doping concentration of the light-emitting guest is 3 wt %, and the doping concentration of the auxiliary guest is 10 wt %, in order to obtain the doping concentrations of the light-emitting guest and the auxiliary guest, a host material film layer having a film thickness of 348 Angstroms, a light-emitting guest film layer having a film thickness of 12 Angstroms, and an auxiliary guest film layer having a film thickness of 40 Angstroms may be individually produced to obtain a desired light-emitting sublayer. In the production process of the light-emitting sublayer, the rates and the film thicknesses of the host material film layer, the auxiliary guest film layer, and the light-emitting guest film layer may be monitored with a crystal oscillator simultaneously to achieve required doping concentrations. The host material film layer, the auxiliary guest film layer, and the light-emitting guest film layer may be produced by an evaporation method, and may be evaporated simultaneously.

In the organic light-emitting device of this embodiment, the anode 200 is an anode, and the cathode 1000 is a cathode. As also can be seen from FIG. 5, the organic light-emitting device may further comprise a substrate 100, and the substrate 100 is on a side of the anode 200 departing from the cathode 1000. The substrate 100 may be a glass substrate, or may be a flexible substrate, for example, one of polyester compounds and polyimide compounds. The anode 200 may be an individual film layer, or may be a multilayer film layer. The material of the anode 200 may be an inorganic material, for example, metal oxides such as indium tin oxide (ITO), indium zinc oxide (IZO), and the like, or metals having a relatively high work function such as gold, silver (Ag), copper, and the like. When the organic light-emitting device is a bottom-emission device, i.e., a light emergent side is located in a lower part of the substrate 100, the anode 200 is preferably produced from transparent ITO. When the organic light-emitting device is a top-emission device, i.e., a light emergent side is located in an upper part of the cathode 1000, the material of the anode 200 is preferably a composite layer having a three-layer structure of ITO/Ag/ITO. The anode 200 may also be an organic electrically conductive polymer, for example PEDOT:PSS, and the like. The material of the cathode 1000 may comprise one or more of metals having a low work function, such as magnesium (Mg), silver (Ag), and aluminum (Al).

The organic light-emitting device may further sequentially comprise a hole injection layer 300 and/or a hole transport layer 400 between the anode 200 and the light-emitting layer 600. The hole injection layer 300 may be produced from a material having a relatively strong ability capability of hole injection, for example, HATCN (2,3,6,7,10,11-hexacyano-1,4,5,8,9,12-hexaazatriphenylene) or a p-doped material. The p-doped material may comprise a material formed by doping NPB (N,N'-bis(1-naphthyl)-N,N'-diphenyl-1,1'-biphenyl-4-4'-diamine) with $F_4$-TCNQ (2,3,5,6-tetrafluoro-7,7',8,8'-tetracyanodimethyl-p-quinone). The hole transport layer 400 may employ a p-type organic semiconductor material having a relatively strong capability of hole transport, for example triphenylamine compounds. The triphenylamine compounds may include one of materials such as NPB, TPD (N,N'-bis(3-methylphenyl)-N,N'-diphenylbenzidine), TAPC (4,4'-cyclohexylbis[N,N-bis(4-methylphenyl)aniline]), and the like.

The organic light-emitting device may further comprise an electron injection layer 900 and/or an electron transport layer 800 between the light-emitting layer 600 and the cathode 1000. The material of the electron transport layer 800 may comprise at least one of n-type organic semiconductor materials having a relatively good capability of electron transport, such as TPBi (1,3,5-tris(1-phenyl-1H-benzimidazol-2-yl)benzene), Alq3 (tris(8-hydroxyquinolinato)aluminum, and BAlq (bis(2-methyl-8-hydroxyquinolinato-N1,O8)-(1,1'-biphenyl-4-hydroxy)aluminum.

As shown in FIG. 5, the organic light-emitting device may further comprise an electron blocking layer 500 and/or a hole blocking layer 700. The electron blocking layer 500 is between the hole transport layer 400 and the light-emitting layer 600, the hole blocking layer 700 is between the light-emitting layer 600 and the electron transport layer 800. The electron blocking layer 500 and/or the hole blocking layer 700 may restrict carriers in the light-emitting layer so as to further improve the uniformity of the exciton concentration in different positions of the light-emitting sublayer and improve the uniformity of the light emission of the light-emitting sublayer. The material of the electron blocking layer 500 may comprise a p-type organic semiconductor material having a relatively high LUMO energy level, such as TCTA (tris(4-carbazol-9-yl-phenyl)amine) and the like. The material of the hole blocking layer 700 may comprise an organic n-type semiconductor material having a relatively low HOMO energy level (<−6 eV), such as T2T (2,4,6-tris (1,1'-biphenyl)-1,3,5-triazine) and the like.

The organic light-emitting device may further comprise an electron injection layer 900. The electron injection layer 900 is between the electron transport layer 800 and the cathode 1000. The material of the electron injection layer 900 may comprise a metal or a metal compound having a low work function, such as lithium fluoride (LiF), ytterbium (Yb), terbium (Tm), and the like.

Table 1 shows a part of materials of the film layers of the organic light-emitting device as shown in FIG. 5. As can be seen from Table 1, the doping concentration of the auxiliary guest (of which the material is 4CzTPN-Ph) in the light-emitting sublayer gradually decreases as the number of the light-emitting sublayers increases, along a direction from the anode 200 toward the cathode 1000. That is, the doping concentrations of the auxiliary guests (of which the material is 4CzTPN-Ph) in the first light-emitting sublayer 610, the second light-emitting sublayer 620, and the third light-emitting sublayer 630 are 20 wt %, 15 wt %, and 10 wt %, respectively.

TABLE 1

A part of materials of the film layers of the organic light-emitting device as shown in FIG. 5

| Name of film layer | Material | Thickness of film layer (unit: Angstrom) |
| --- | --- | --- |
| Cathode 1000 | Al | 1500 |
| Electron injection layer 900 | LiF | 10 |
| Electron transport layer 800 | Alq3 | 350 |

TABLE 1-continued

A part of materials of the film layers of the organic light-emitting device as shown in FIG. 5

| Name of film layer | Material | Thickness of film layer (unit: Angstrom) |
|---|---|---|
| Third light-emitting sublayer 630 | CBP:4CzTPN-Ph:C545T (doping concentration ratio: 0.89:0.1:0.01) | 150 |
| Second light-emitting sublayer 620 | CBP:4CzTPN-Ph:C545T (doping concentration ratio: 0.84:0.15:0.01) | 150 |
| First light-emitting sublayer 610 | CBP:4CzTPN-Ph:C545T (doping concentration ratio: 0.79:0.2:0.01) | 150 |
| Hole transport layer 400 | NPB | 300 |
| Hole injection layer 300 | HATCN | 50 |
| Anode 200 | ITO | |

As also can be seen from Table 1, the doping concentrations of the light-emitting guests in the first light-emitting sublayer 610, the second light-emitting sublayer 620, and the third light-emitting sublayer 630 are the same and are 1 wt % in the organic light-emitting device.

A relatively uniform distribution of the exciton concentration may be achieved in the light-emitting device.

Figure 6:
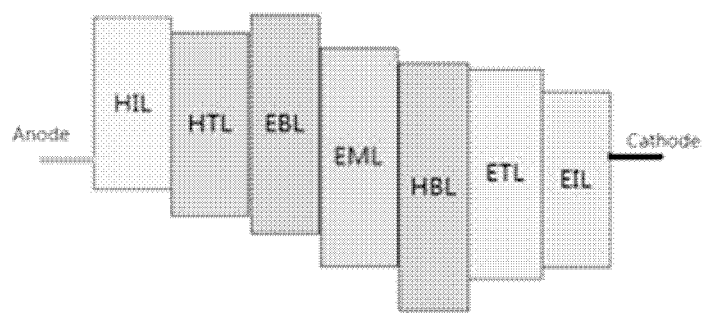
FIG. 6 is a schematic diagram of the main structure of an organic light-emitting device in an embodiment of this disclosure.

FIG. 6 is a schematic diagram of the main structure of an organic light-emitting device in an embodiment of this disclosure. As can be seen from FIG. 6, the main structure of the organic light-emitting device may comprise an anode, a hole injection layer (HIL), a hole transport layer (HTL), an electron blocking layer (EBL), a light-emitting layer (EML), a hole blocking layer (HBL), an electron transport layer (ETL), an electron injection layer (EIL), and a cathode. With respect to the organic light-emitting device in an embodiment of this disclosure, the materials of the light-emitting layer comprise a host material, a light-emitting guest, and an auxiliary guest. The light-emitting guest is a fluorescent dye, and the auxiliary guest comprises an organic substance having a TADF property. There is no complex of iridium, which is precious, in the light-emitting guest, but a maximum internal quantum efficiency of 100% may be achieved and the cost is saved. When a section in which a doping concentration of the auxiliary guest gradually increases or gradually decreases is present along a direction from the anode toward the cathode, the uniform concentration of excitons in the light-emitting layer is achieved and the efficiency and the service life of the device are improved.

Figure 7:
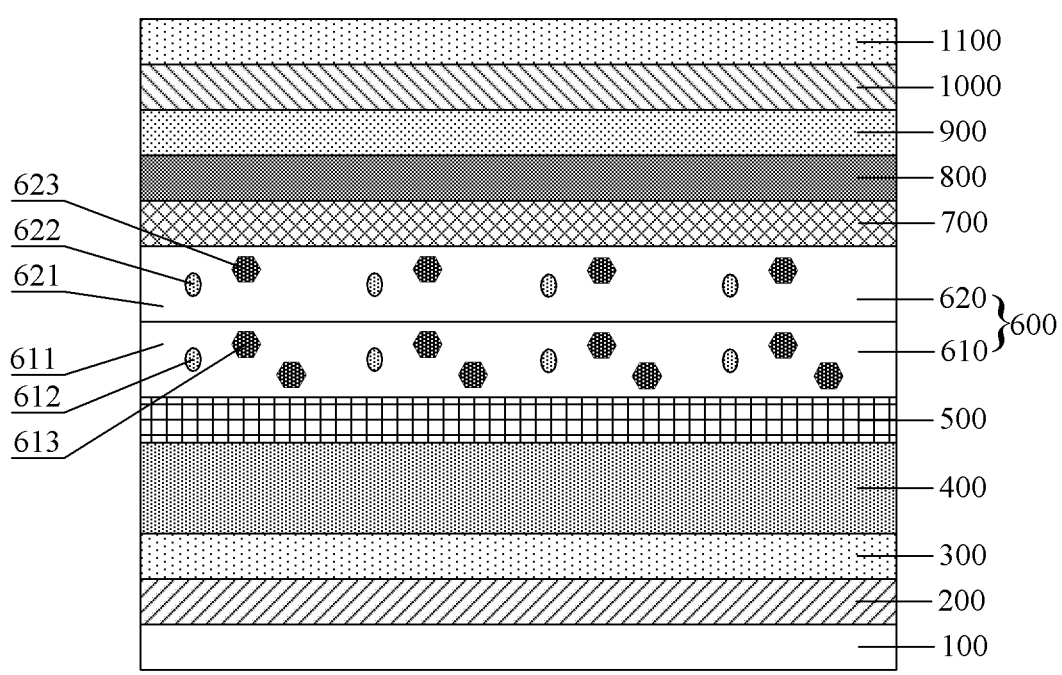
FIG. 7 is a schematic diagram of the structure of a top-emission organic light-emitting device in an embodiment of this disclosure.

FIG. 7 is a schematic diagram of the structure of a top-emission organic light-emitting device in a second embodiment of this disclosure. In this embodiment, the light emergent surface is on a side of the cathode 1000 departing from the anode 200 as shown in FIG. 7, which is different from the first embodiment. The top-emission organic light-emitting device further comprises a light extraction layer 1100. The light extraction layer 1100 is on a side of the cathode 1000 departing from the light-emitting layer 600. The light extraction layer may improve the light emission rate of the organic light-emitting device and improve the brightness of the organic light-emitting device. In a specific embodiment, the light extraction layer 1100 has an average refractive index of greater than or equal to 1.7 in a range of visible light, and for example, may be produced from NPB.

Table 2 shows a part of materials of the film layers of the top-emission organic light-emitting device as shown in FIG. 7. As can be seen from Table 2, the doping concentration of the auxiliary guest (4CzTPN-Ph) in the light-emitting sublayer gradually decreases, along a direction from the anode 200 toward the cathode 1000. That is, the doping concentrations of the auxiliary guests in the first light-emitting sublayers 610 and the second light-emitting sublayers 620 are 10 wt % and 5 wt %, respectively.

TABLE 2

A part of materials of the film layers of the top-emission organic light-emitting device as shown in FIG. 7

| Name of film layer | Material | Thickness of film layer (unit: Angstrom) |
|---|---|---|
| Light extraction layer 1100 | NPB | 600 |
| Cathode 1000 | Mg:Ag (concentration ratio 9:1) | 150 |
| Electron transport layer 800 | TPBi | 350 |
| Second light-emitting sublayer 620 | mCBP:4CzTPN:TBRb (doping concentration ratio: 0.94:0.05:0.01) | 200 |
| First light-emitting sublayer 610 | mCBP:4CzTPN:TBRb (doping concentration ratio: 0.89:0.1:0.01) | 200 |
| Hole transport layer 400 | TCTA | 1500 |
| Hole injection layer 300 | HATCN | 50 |
| Anode 200 | ITO/Ag/ITO | |

As also can be seen from Table 2, the doping concentrations of the light-emitting guests in the first light-emitting sublayer 610 and the second light-emitting sublayer 620 are the same and are 1 wt % in the top-emission organic light-emitting device.

A relatively uniform distribution of the exciton concentration may be achieved in the light-emitting device.

Based on the inventive concepts of the embodiments described above, an embodiment of this disclosure further provides a display panel. The display panel comprises an organic light-emitting device of any embodiment described above, and further comprises a thin-film transistor for driving the organic light-emitting device. The display panel may be any product or member having the function of display, such as a cell phone, a tablet computer, a television, a display, a laptop, a digital photo frame, a navigator, etc.

In the description of embodiments of this disclosure, it is to be understood that orientations and positional relationships indicated by terms, such as "middle", "on", "under", "front", "rear", "vertical", "horizontal", "top", "bottom", "in", "out", and the like, are based on orientations or positional relationships as shown in figures. They are merely intended to facilitate the description of this disclosure and simplify the description, but do not indicate or imply that indicated apparatuses or elements necessarily have specific orientations and are configured and operated in specific orientations. Therefore, they may not be understood as limit to this disclosure.

Although the embodiments of this disclosure are as described above, the contents described are merely embodiments used to facilitate understanding of this disclosure, and they are not intended to limit this disclosure. Any modification and variation in the form and details of implementation may be made by any person in the art to which this disclosure pertains without departing from the spirit and the scope disclosed by this disclosure. However, the patent scope protected by this disclosure should be still defined by the appended claims.

What is claimed is:

1. An organic light-emitting device, comprising:
an anode;
a cathode opposite to the anode; and
a light-emitting layer between the anode and the cathode,
wherein the light-emitting layer comprises a host material, a light-emitting guest, and an auxiliary guest, the light-emitting guest is a fluorescent dye, and the auxiliary guest is an organic substance having a thermally activated delayed fluorescence property,
wherein a section in which a doping concentration of the auxiliary guest gradually increases or gradually decreases is present along a direction from the anode toward the cathode,
wherein the light-emitting layer comprises at least two light-emitting sublayers adjacent to each other, the auxiliary guest has a uniform doping concentration in each of the light-emitting sublayers, and a doping concentration of the auxiliary guest in each of the light-emitting sublayers is different from a doping concentration of the auxiliary guest in a light-emitting sublayer adjacent thereto.

2. The organic light-emitting device according to claim 1, wherein the difference between doping concentrations of auxiliary guests in adjacent light-emitting sublayers is 1 wt % to 10 wt %.

3. The organic light-emitting device according to claim 1, wherein the auxiliary guest in each of the light-emitting sublayers has a doping concentration of 5 wt % to 50 wt %.

4. The organic light-emitting device according to claim 1, wherein each of the light-emitting sublayers has a thickness of 20 Angstroms to 200 Angstroms.

5. The organic light-emitting device according to claim 1, wherein
majority carriers in the host material are electrons,
and wherein a section in which a doping concentration of the auxiliary guest gradually increases is present along a direction from the anode toward the cathode.

6. The organic light-emitting device according to claim 1, wherein
majority carriers in the host material are holes
and wherein a section in which a doping concentration of the auxiliary guest gradually decreases is present along a direction from the anode toward the cathode.

7. The organic light-emitting device according to claim 1, wherein a thickness of the section comprises 50% or more of a thickness of the light-emitting layer along a direction from the anode toward the cathode.

8. The organic light-emitting device according to claim 1, wherein a material of the auxiliary guest comprises at least one of PXZ-TRZ, 4CzIPN, 4CzTPN, 4CzTPN-Me, and 4CzTPN-Ph.

9. The organic light-emitting device according to claim 1, wherein the light-emitting guest has a doping concentration of 0.1 wt % to 10 wt %.

10. The organic light-emitting device according to claim 9, wherein the light-emitting guest has a doping concentration of 0.2 wt % to 5 wt %.

11. The organic light-emitting device according to claim 1, further comprising a hole transport layer between the anode and the light-emitting layer, and an electron transport layer between the light-emitting layer and the cathode,
wherein the organic light-emitting device further comprises:
an electron blocking layer between the hole transport layer and the light-emitting layer, and/or a hole blocking layer between the light-emitting layer and the electron transport layer.

12. The organic light-emitting device according to claim 1, wherein a light emergent surface of the organic light-emitting device is on a side of the anode departing from the cathode, and the organic light-emitting device further comprises a light extraction layer on a side of the cathode departing from the light-emitting layer.

13. The organic light-emitting device according to claim 1, wherein the light extraction layer has an average refractive index of greater than or equal to 1.7 in a range of visible light.

14. A display panel, comprising the organic light-emitting device of claim 1.

* * * * *